United States Patent [19]

Marshall

[11] Patent Number: 4,723,318
[45] Date of Patent: Feb. 2, 1988

[54] ACTIVE POLYPHASE FILTERS
[75] Inventor: Christopher B. Marshall, Horley, United Kingdom
[73] Assignee: U.S. Philips Corporation, New York, N.Y.
[21] Appl. No.: 809,538
[22] Filed: Dec. 16, 1985
[30] Foreign Application Priority Data
Dec. 19, 1984 [GB] United Kingdom ............... 8432011
[51] Int. Cl.$^4$ .................... H04B 1/10; H03C 3/00
[52] U.S. Cl. ............................. 455/109; 455/306; 455/307; 307/359; 332/45
[58] Field of Search ............. 455/109, 203, 302, 306, 455/307; 328/167; 307/520, 359; 332/45; 364/825; 330/294, 302

[56] References Cited
U.S. PATENT DOCUMENTS
3,611,165 10/1971 Hills .................... 307/520
4,339,727 7/1982 Kage et al. .................... 307/359
4,446,438 5/1984 Chang et al. .................... 333/173

Primary Examiner—Robert L. Griffin
Assistant Examiner—Curtis Kuntz
Attorney, Agent, or Firm—Thomas A. Briody; Jack Oisher; William J. Streeter

[57] ABSTRACT

An active polyphase filter arrangement in which asymmetric poles and zeros are obtained using feedback. In implementing the active polyphase filter arrangement there is provided a feedforward path comprising a first polyphase filter and a feedback path comprising a second polyphase filter. Both filters are preferably two phase filters. In operating the polyphase filter arrangement the loop gain at the unwanted "image" frequency can either be made much greater than unity thereby making the feed forward path insensitive to mismatching or be made much less than unity thereby making the feedback path insensitive to mismatching.

10 Claims, 11 Drawing Figures

ACTIVE POLYPHASE FILTERS

The present invention relates to active polyphase filters and to a receiver and a transmitter including such filters.

In many radio systems it is required to distinguish between a signal frequency that is above or below the frequency of a local oscillator and to attenuate one relative to the other. This filtering may either be implemented before the mixer, as in a superheterodyne receiver, or after it, as in some single sideband (SSB) receivers. In the latter approach at least two mixers must be employed, actuated by the modulating signals with distinct phases. This enables "positive" and "negative" frequency signals, produced by inputs above and below the local oscillator, to be distinguished. Polyphase filters can make use of multiple phase shifted inputs to produce asymmetric transfer functions. The use of polyphase networks in single sideband modulation is known from an article "Single Sideband Modulation using Sequence Asymmetric Polyphase Networks" by M. J. Gingell in Electrical Communication, Volume 48, Number 1 and 2, 1973, pages 21 to 25. Normally the polyphase filters realise asymmetric zeros as opposed to asymmetric poles. Further unless polyphase filters are fabricated from close tolerance components then there is a risk of an unbalance between the channels.

SUMMARY OF THE INVENTION

Accordingly an object of the present invention is to provide a polyphase filter circuit which can easily realise asymmetric poles as well as asymmetric zeros and in which the effects of component tolerances is reduced.

According to the present invention there is provided an active polyphase filter arrangement in which feedback is used to produce the desired filter frequency response.

In the present specification by an active polyphase filter is meant a filter which is implemented using amplifiers, for example operational amplifiers, to provide gain and to provide isolation between the impedances in different parts of the filter. The advantage of using active filter circuits is the ease of design of the filter and the circuit itself.

By using a suitably chosen second polyphase filter to form the feedback path of the first polyphase filter, the filter arrangement can be made generally insensitive to imbalance effects. Also the filter arrangement can produce asymmetric poles as well as zeros. Further, in such arrangements, if the loop gain evaluated at the image frequency is larger, then the circuit is insensitive to mismatch between the two I and Q paths in the feed forward section. However the circuit would still be sensitive to component mismatch in the feedback part of the filter. The problem of mismatch only arises when there are two I and Q paths so that by mixing to r.f. then the problem of mismatch is avoided.

Lattice networks are known in the art and for example are discussed by C. Dillon in "Sensitivity considerations in cascaded lattice-type quadrature-modulation networks" IEE PROC. Vol. 128Pt.G No. 4, August 1981, pages 154 to 157. In such circuits the number of paths is reduced to at least two by omitting two phases out of the four phases generally required and replacing them with an inverter. Thus the component count is reduced. In a practical application of such a simplified filter, a single sideband signal can be provided by feeding the filter arrangement in accordance with the present invention from a pair of quadrature mixers, the overall circuit behaviour being equivalent to a full four phase polyphase network. The network obtained will work, with a modified frequency response, for any phase angle between the channels.

The present invention will now be described, by way of example, with reference to the accompanying drawings.

DESCRIPTION OF THE FIGURES

In the drawings corresponding reference numerals have been used to indicate the same features.

DESCRIPTION OF THE PREFERRED EMBODIMENT

Figure 1:
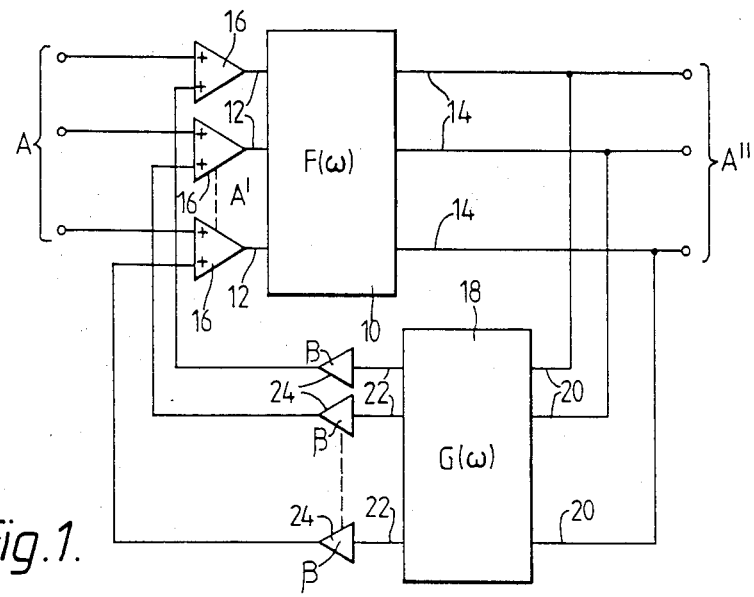
FIG. 1 is a block schematic circuit diagram of an M-phase polyphase lattice filter arrangement made in accordance with the present invention.

Referring to FIG. 1 the polyphase filter arrangement comprises a first M-phase polyphase filter 10 having an input 12 and an output 14 for each of the M-phases. A two input summing amplifier 16 is connected to each input 12. One input of each amplifier 16 is connected to receive a respective phase of an M-phase input A. The other input of each of the amplifiers 16 receives a feedback signal as will be described.

A second M-phase polyphase filter 18 having M inputs 20 and outputs 22 provides a feedback loop with the inputs 20 connected to the outputs 14 of corresponding phase of the filter 10. The outputs 22 are connected to respective amplifiers 24 having a gain $\beta$ which amplifiers are connected to the respective other inputs of the amplifiers 16.

If the transfer functions of the filters 10 and 18 are $F(\omega)$ and $G(\omega)$ respectively and the signals at the input, after entry into the feedback loop and at the output are A, A', and A", respectively, then $$A' = A + \beta \cdot G(\omega) \cdot A''$$

and $$A'' = F(\omega) \cdot A'$$

On solution this gives:

$$[I - \beta \cdot F(\omega) \cdot G(\omega)] A'' = F(\omega) \cdot A$$

which can be written $$A'' = [I - \beta \cdot F(\omega) \cdot G(\omega)]^{-1} F(\omega) \cdot A$$

The overall transfer function is then:

$$\frac{A''}{A} = \frac{F(\omega)}{[I - \beta \cdot F(\omega) \cdot G(\omega)]}$$

In general $A''/A$ has zeros when $F(\omega)$ has zeros or $G(\omega)$ has poles.

Also, in general $A''/A$ has poles when $[\beta \cdot F(\omega) \cdot G(\omega)] = I$.

Finally the transfer function $A''/A$ has a regular value $-[\beta \cdot G(\omega)]^{-1}$ in a pole of $F(\omega)$.

Since asymmetric zeros may easily be implemented in polyphase networks, asymmetric poles and zeros can be produced in the overall response. By suitably choosing $F(\omega)$, $G(\omega)$ and $\beta$ a filter can be constructed in which the effects due to imbalance between paths are attenuated. These effects are an important consideration when rejection of an image signal by 60 dB or so is required, as even 1% tolerance tends to limit the obtainable rejection to 40 dB.

Figure 2:
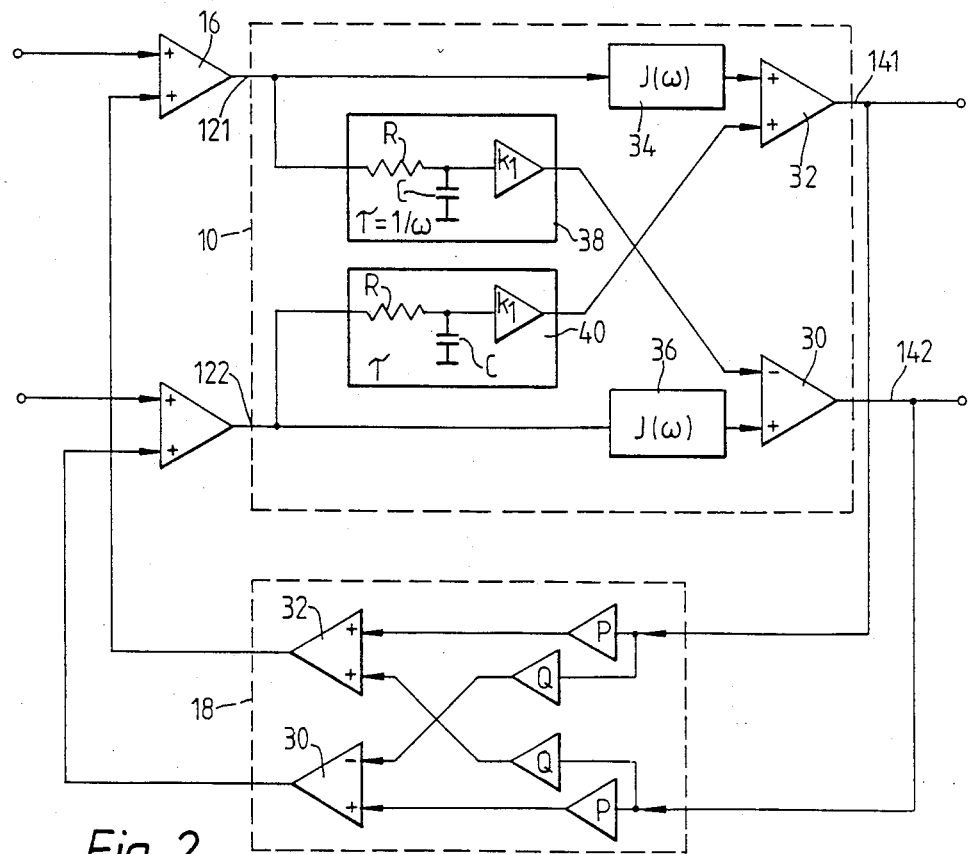
FIG. 2 is an embodiment of FIG. 1 for $M=2$.

FIG. 2 is a schematic circuit diagram of a filter arrangement which behaves as a four-phase arrangement but which has only two paths to which quadrature related signal are applied. This saving of paths is achieved by providing differencing or inverting amplifiers 30 in the filters 10, 18 rather than summing amplifiers 32 as provided in the other paths. The construction of both filters 10, 18 is substantially the same and in the interests of brevity, the filter 10 will be described in detail.

The inputs 121, 122 of the filter 10 are connected by circuits 34, 36 to non-inverting inputs of the amplifiers 32, 30. The transfer function due to circuits 34, 36 is $J(\omega)$. The input 121 is cross connected by another circuit 38 to the non-inverting input of the amplifier 30 and the input 122 is cross connected by another circuit 40 to a non-inverting input of the amplifier 32. The transfer function of the circuits 38 and 40 is $K(\omega)$.

The overall transfer function $F(\omega)$ of the filter 10 is $$F(\omega) = J(\omega) + jK(\omega)$$

where j is the square root of $-1$ (viz $\sqrt{-1}$). In this transfer function $jK(\omega)$ provides the asymmetry.

The circuits 38, 40 can conveniently be an R-C network to provide a zero as well as a pole and $J(\omega)$ can conveniently be unity. This allows parameters to be chosen which lead to circuit simplicity or minimum sensitivity to component variations, for example, without restricting the range of transfer functions that can be obtained.

In the case of $J(\omega) = 1$ and $$K(\omega) = k\left(\frac{s + d}{s + \Delta\omega}\right)$$

where $s = j\omega$ the input frequency.

The transfer function of the filter 10 can be written as $$F(\omega) = J(\omega) + jK(\omega)\Delta(1 + jk)\frac{(s + j\gamma + \delta\omega)}{(s + \Delta\omega)}$$

where $$\gamma = k\left(\frac{d - \Delta\omega}{1 + k^2}\right) \text{ and } \delta\omega = \frac{\Delta\omega + k^2 d}{1 + k^2}$$

or alternatively $$\Delta\omega = \delta\omega - k\gamma$$

and $$d = \delta\omega + \gamma/k.$$

Figure 3:
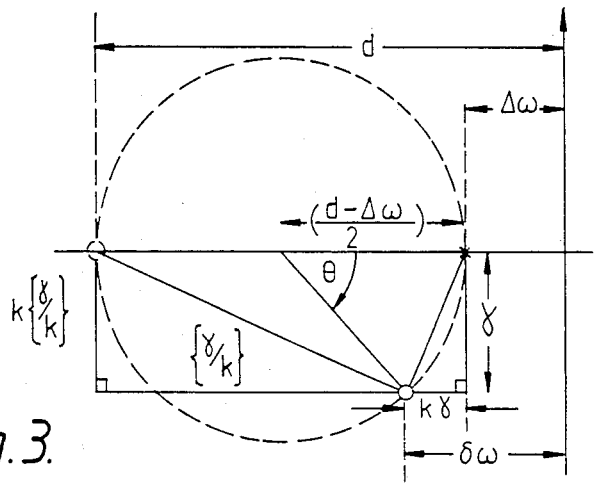
FIG. 3 is an s-plane diagram illustrating the lattice network transfer function, FIG. 4 are s-plane diagrams illustrating the polyphase feedback vectors, the left hand diagram is of the feed forward section and the right hand diagram shows the loop response.

This is illustrated in FIG. 3 an s-plane diagram in which a pole is denoted by a cross and a zero by a small circle. The diagram also shows that a pair of similar right-angled triangles can be constructed around the transfer function zero using the above results. As the triangles are similar the internal angle at the zero must be 90°, and therefore the zero must lie on the circle shown dashed. The circle passes through the K network pole and zero locations so it has a centre $= (d + \Delta\omega)/2$ and, $$\text{radius} = \left|\frac{d - \Delta\omega}{2}\right|$$

Both of these expressions are independent of amplifier gain, k.

The parameter k determines the location of the zero on the circle, represented by the angle $\theta$. The relationship between them can be found directly from the triangles, $$\tan \theta = \frac{\gamma}{(\gamma/k + k\gamma)/2 - k\gamma} = \frac{2k}{1 + k^2}$$

so $k = \tan(\theta/2)$ this relationship also holds for $d < \Delta\omega$ if $\theta$ is defined as the angle clockwise to the zero from the pole, as in FIG. 3. There are several points which should be noted from FIG. 3. Firstly if $k = 0$ then $\theta = 0$ and the pole and zero of the transfer function coincide and therefore cancel. This is as should be expected, for if the amplifier gain is zero then the filter ($\underline{K}$) can play no part in the response. As the amplifier gain is increased, $\theta$ increases and results in an increasingly asymmetric lattice network transfer function. For small values of $\theta$ the damping of the zero is insensitive to variations in amplifier gain. The most asymmetry occurs at $\theta = 90°$, corresponding to unity gain amplifiers ($k = 1$) which may of course be omitted. At this point the zero's frequency is equal to the radius of the circle, so we have $$|\gamma| \leq \left|\frac{d - \Delta\omega}{2}\right|.$$

At the maximum the frequency is first order insensitive to the amplifier gain, k.

As the amplifier gain increases further the $\underline{K}$ filter network increasingly dominates the lattice transfer function, and so the zero tends towards the original $\underline{K}$ filter network zero. It can also be seen that if the sign of the amplifier gain is reversed, this is topologically equivalent to interchanging the two polyphase signal paths. This has the effect of producing the transpose of the frequency response. In terms of the foregoing analysis the change of sign of k results in the change of sign of $\theta$, and so the positive and negative frequency responses are interchanged as required.

For large K network zero damping, i.e. large $\underline{d}$, these results tend towards the conclusion for the simple, pole only lattice network. As $\underline{d}$ increases the circle diameter increases, tending towards the vertical broken straight line through the pole, as in FIG. 3. Then we have tan $(\theta/2) \simeq \frac{1}{2} \tan \theta$, as $\theta$ is small, and so with the identity $$k_1 = k \frac{d}{\Delta \omega}$$

we have $\gamma \simeq d/2 \tan \theta = k_1 \Delta \omega$ as before.

Figure 4:
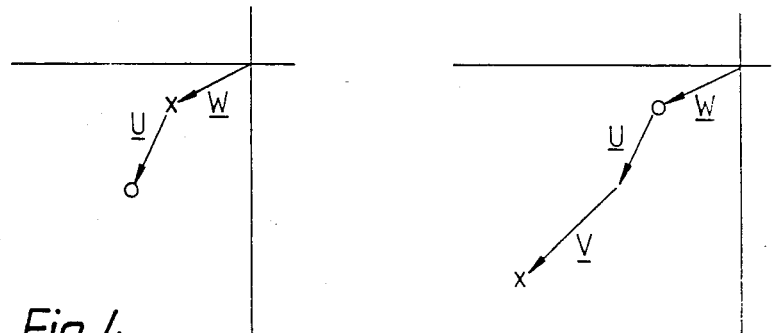

Turning now to the effect of applying polyphase feedback, FIG. 4 illustrates the notation to be used and the polyphase filter section to be considered, that is the feed forward section. Although in most cases the filter section pole will lie on the real axis, internal feedback loops can be applied to produce an asymmetrically placed pole as shown. The vectors represent complex numbers, and therefore normal rules for complex algebra apply. As an example the transfer function in FIG. 3 would be represented in vector terminology as $\underline{W} = -\Delta \omega$ and $\underline{U} = -k\gamma - j\gamma$.

In the light of the results on the lattice network we will define $$\underline{F}(\omega) = \underline{k} \frac{s + (\underline{W} + \underline{U})}{s + \underline{W}}$$

where $\underline{k} = 1 + jk$ and put $$\underline{G}(\omega) = \underline{G} = P + jQ$$

the transfer function of the feedback network then if the loop response is $L(\omega)$, then $$L(\omega)^{-1} = 1 - \underline{F}(\omega) \cdot \underline{G}(\omega), \beta = 1$$

$$= (1 - \underline{G}\underline{k}) \frac{s + \underline{W} - \underline{U} \frac{\underline{G}\underline{k}}{1 - \underline{G}\underline{k}}}{s + \underline{W}}$$

Define $\underline{G}_{k'} = \underline{G}\,\underline{k} - 1$ then $$\underline{L}(\omega) = \frac{1}{\underline{G}_{k'}} \left( \frac{s + \underline{W}}{s + \underline{W} + \underline{U} + \underline{U}\frac{1}{\underline{G}_{k'}}} \right)$$

thus, by comparison we have $$\underline{V} = \underline{U}(\underline{G}_{k'})^{-1} \text{ or } \underline{V} = \underline{U}(\underline{G}\underline{k} - 1)^{-1}$$

when written in full, this surprisingly simple expression for $\underline{V}$ is an agreement with qualitative arguments. It is, for example, the product of the feed forward and feedback network's gains that determines the loop gain of the circuit, the complex product handling the phase contribution as well. The loop response reduces to unity, i.e. $\underline{V} \rightarrow -\underline{U}$ for small feedback gains, while for very large gains around the loop $\underline{V} \rightarrow 0$ and the loop response becomes the inverse of that of the feed-forward section to give unity transfer function from input to output.

Any loop response pole position can be obtained for any given feed-forward section through appropriate choice of the feedback network gains, and so any transfer function can be realised. The various classes of transfer function are obtained by taking the section output from different points around the loop as catalogued in FIGS. 5A to 5D which show the different transfer function options. However if $\underline{V}$ is to be large compared with $\underline{U}$ then the feedback parameters become very critical, so for practical circuits it is best to keep $\underline{U}$ and $\underline{V}$ comparable.

Figure 5A:
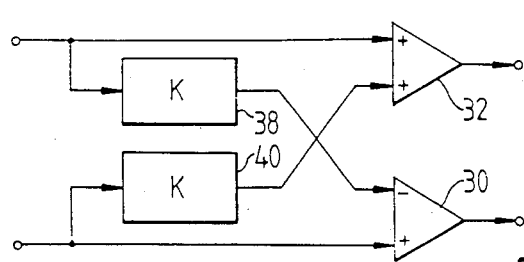
FIGS. 5A to 5D illustrate the transfer function options with polyphase feedback.
Figure 5A:
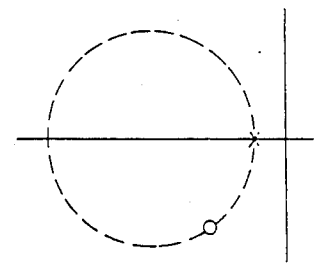

FIG. 5A illustrates the F networks only and the associated s-plane diagram illustrates that there is an asymmetric zero and a symmetric pole. The gain of the circuit is $(1+jk)$.

Figure 5B:
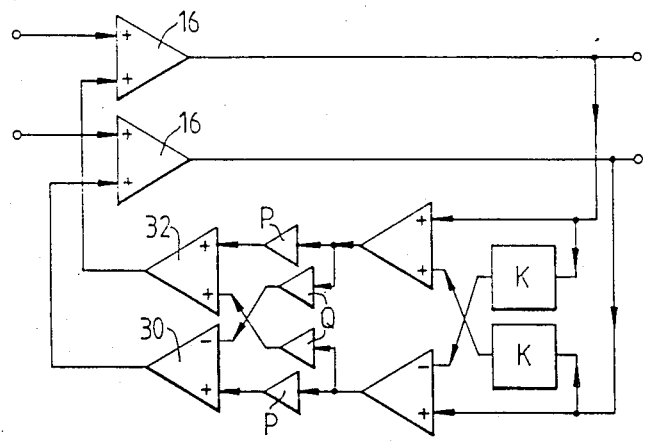
Figure 5B:
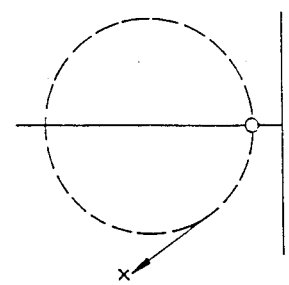

FIG. 5B illustrates a circuit which gives rise to the loop response only and the associated s-plane diagram shows that there is an asymmetric pole and a symmetric zero. The gain of the circuit is $(\underline{G}\underline{k}-1)^{-1}$.

Figure 5C:
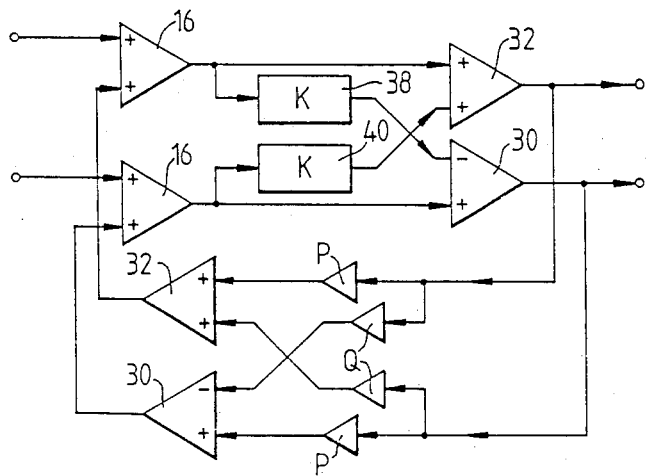
Figure 5C:
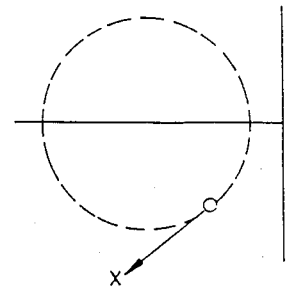

FIG. 5C illustrates the arrangement to give a complete closed loop response and the associated s-plane diagram shows both the pole and zero placed asymmetrically. The gain of the circuit is $\underline{k}(\underline{G}\underline{k}-1)^{-1}$.

Figure 5D:
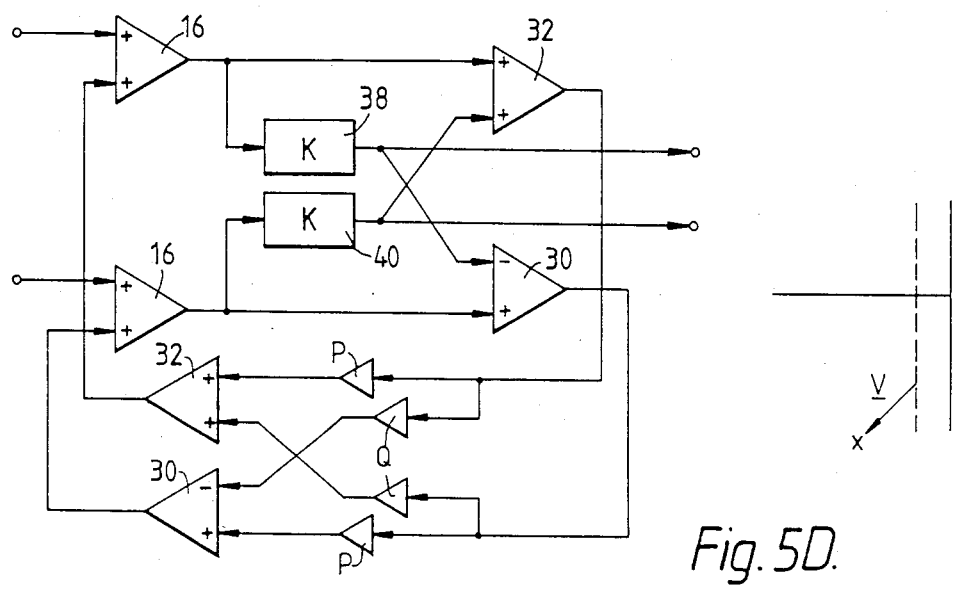

Finally FIG. 5D illustrates the intermediate response for a single pole K and the associated s-plane diagram shows that one has an asymmetric pole only, the gain being $\underline{k}(\underline{G}\underline{k}-1)^{-1}$.

The analyses have shown that any complex transfer function, comprising a pole and zero or single pole, can be implemented by applying polyphase feedback around polyphase filter. Higher order filters can easily be built up by cascading a number of these polyphase sections, for example to realise an elliptic SSB filter.

Figure 6:
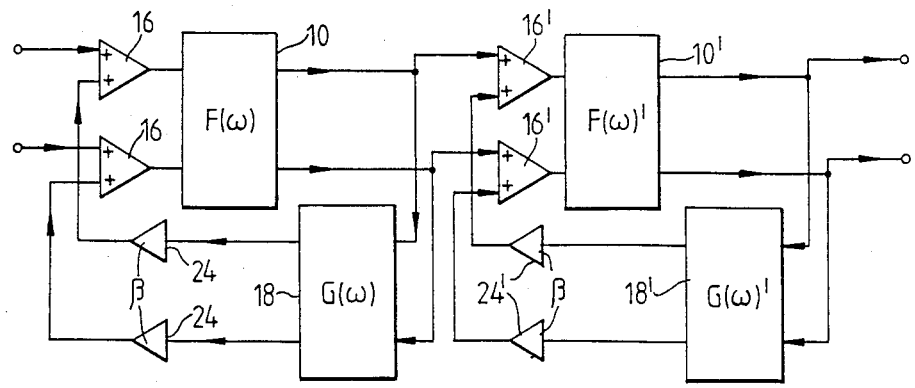
FIG. 6 illustrates a filter comprising at least two polyphase filter sections connected in series.

FIG. 6 illustrates in block schematic form a filter comprising at least two polyphase filter sections of the type illustrated in FIG. 1 connected in cascade. For ease of reference the second filter section has been indicated with primed reference numerals. More than two filter sections can be connected in series if required.

The parameters have been found not to be uniquely determined, so that they can be chosen either to simplify the circuit or to minimise the circuit's sensitivity to the component variations.

Further it has been found that an important parameter which determines the sensitivity to component variations is the magnitude of the loop gain evaluated at the "image" frequency—the frequency which has the same value of |frequency| as the wanted signal but has the opposite sign—that is, the phase relationship between the polyphase paths is reversed. When the loop gain at the image frequency is large, the circuit is insensitive to component mismatches between the I and Q channels in the feed forward part of the circuit, while if the loop gain is very much less than unity, then the circuit is insensitive to mismatch in the feedback portion of the circuit.

Figure 7:
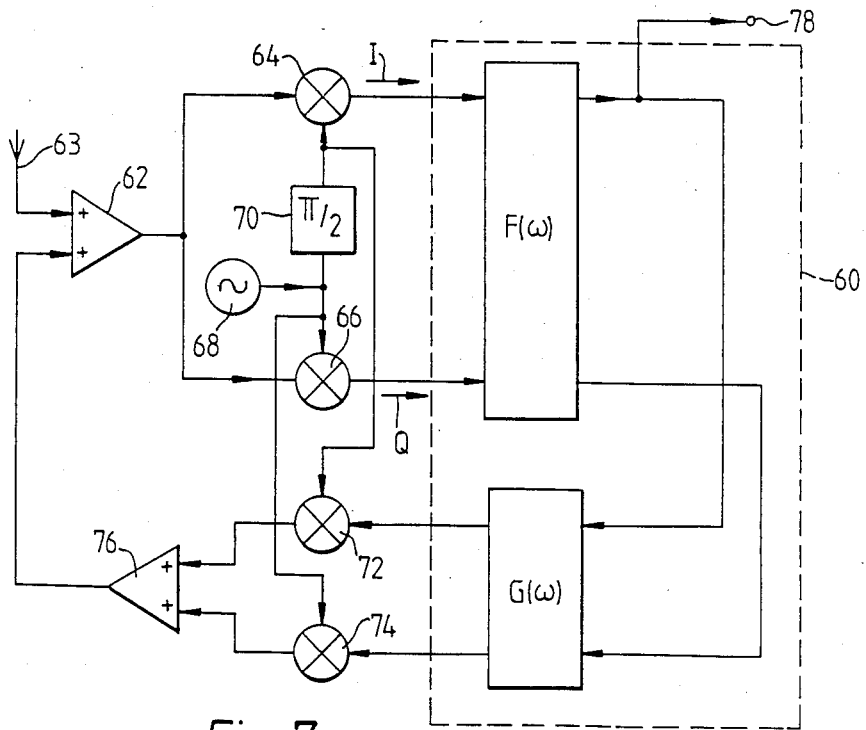
FIG. 7 is a block schematic circuit diagram of a radio receiver including a polyphase filter in accordance with the present invention for use in image rejection.

FIG. 7 shows in greater detail the R.F. section of a radio receiver including a polyphase filter 60 made in accordance with the present invention. The circuit comprises a R.F. summing arrangement constituted by an amplifier 62 having one input connected to an antenna 63 and another input for a feedback signal from the polyphase filter 60. The output of the amplifier 62 is coupled to quadrature mixers 64, 66 which receive a reference signal from a local oscillator 68, that reference signal being supplied to the mixer 64 being phase shifted by $\pi/2$ in the phase shifter 70. By making the local oscillator frequency differ from the input carrier frequency by the desired output i.f., a low frequency signal is derived from each mixer 64, 66.

The illustrated polyphase filter 60 comprises first and second signal paths I and Q which are connected to respective outputs of mixers 64 and 66. The filter 60 is constructed substantially as described previously with the revision that the feedback is implemented via an r.f. path. Accordingly the output from the I signal path is connected to another mixer 72 which receives the same reference signal as the mixer 64. Similarly the output from the Q signal path is connected to a further mixer 74 which receives the same reference frequency as the mixer 66. The outputs of the mixers 72, 74 are applied to a summing amplifier 76 whose output is fed back to the amplifier 62. An i.f. signal having an attenuated image is derived from a terminal 78 which is connected to a low frequency section of the filter 60.

In operation, an input signal is applied to one input of the summing arrangement, that is, the amplifier 62, where it is summed with the feedback signal. The output of the amplifier 62 is applied to the quadrature pair of mixers 64, 66 which translate the signal down to i.f. The outputs of the quadrature pair of mixers 64, 66 then form the inputs to the polyphase filter $F(\omega)$. The i.f. output is taken from the output of $F(\omega)$. The feedback path is provided by the further stage of polyphase filtering $G(\omega)$ which provides outputs which are translated to the original frequency, in this case $\omega_L(=\omega_n)$, by means of the mixers 72, 74. Unwanted products are produced by the mixing operation but since these are out-of-phase whereas the wanted signals are in-phase, the unwanted products are removed by summation in the amplifier 76.

Figure 8:
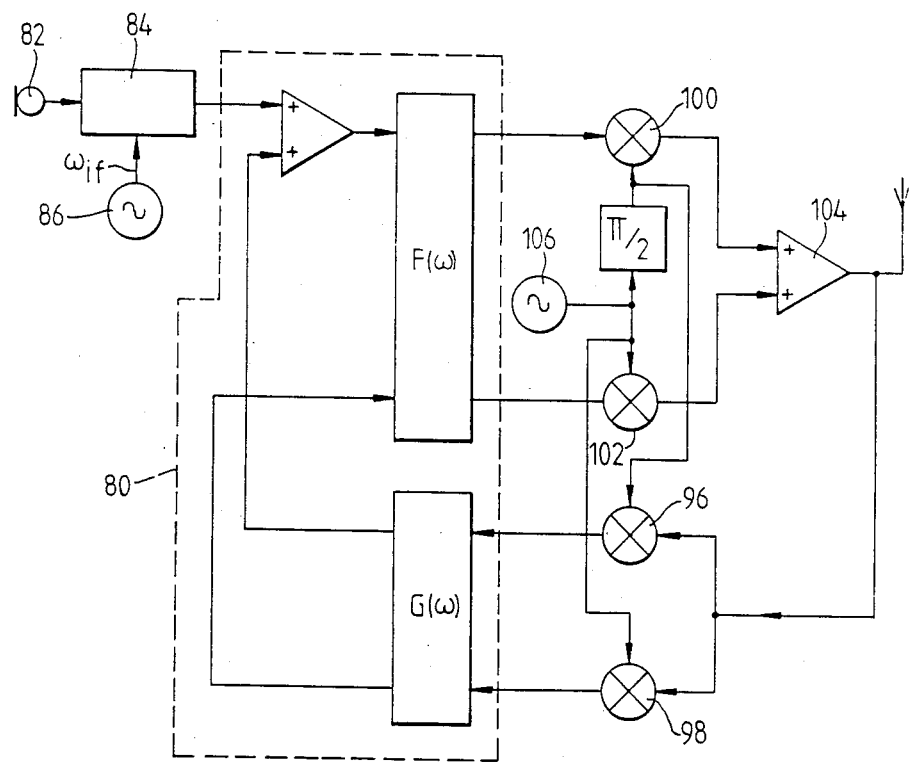
FIG. 8 is a block schematic circuit diagram of a single sideband (SSB) transmitter including a polyphase filter in accordance with the present invention for use in avoiding the generation of the unwanted sideband.

FIG. 8 illustrates an embodiment of an SSB transmitter including a polyphase filter 80 made in accordance with the present invention.

A source 82 of audio signals (a.f) is applied to a modulator 84 which is supplied with an i.f. signal ($\omega_{i.f.}$) from a local oscillator 86. If the output of the modulator 84 is frequency up-converted to the final frequency by means of a single mixer, this operation would generate an image signal as well as a wanted signal. In the transmitter illustrated in FIG. 8 this is avoided by the use of a quadrature pair of mixers 100, 102 in the feed forward path and another pair of mixers 96, 98 in the feedback path. An oscillator 106 provides the final frequency to the mixer 100, 102 to effect frequency up-conversion in the feed forward path and to the mixers 96, 98 to effect frequency down-conversion to the i.f. frequency in the feedback path.

In the illustrated embodiment of the present invention the input and feedback signals have been combined in the summing arrangement 12. However if desired a differencing arrangement can be used with the sign of the feedback circuit $G(\omega)$ being reversed.

I claim:

1. A polyphase filter arrangement comprising a first polyphase filter having at least two phases, the first filter having an input and an output for each of the phases, summing means connected to each of said inputs, a second polyphase filter having the same number of phases as the first filter, the second filter having an input and an output for each of the phases, the inputs of the second filter being connected to corresponding phase outputs of the first filter and the outputs of the second filter being connected to the summing means of corresponding phase to provide a feedback path for the first filter.

2. A filter as claimed in claim 1, wherein the first and second polyphase filters are two phase filters.

3. A filter as claimed in claim 1, wherein polyphase filtering is provided by polyphase lattice filters.

4. A feed forward path polyphase filter having an input and an output for each phase, a feedback path polyphase filter having an input and an output for each said phase, the inputs of the feedback path filter being coupled to the respective corresponding outputs of the feed forward path filter, and the outputs of the feedback filter being coupled to the respective corresponding inputs of the feed forward path filter via respective combination means for combining the respective output signals of the feedback path filter with corresponding phases of an input signal, whereby a closed loop network is formed for each phase.

5. The active polyphase filter of claim 4 wherein said active polyphase filter has an overall loop gain which is greater than unity at an unwanted image signal frequency making said feed forward path insensitive to mismatching.

6. The active polyphase filter of claim 4 wherein the loop gain of said active polyphase filter circuit is less than unity at an image signal frequency making the feedback path insensitive to mismatching.

7. An active polyphase filter circuit comprising:
   a feed forward path including a first polyphase active filter of at least two phases having an input and output for each of said two phases;
   a feedback path including a second polyphase filter having as many phases as said first polyphase filter, each phase input of said second polyphase filter being connected to a respective output of said first polyphase filter, and providing multiple output phases; and
   summing means for each of said phases for summing each phase of an input signal to said feed forward path with a phase signal from an output of said feedback path polyphase filter.

8. An active polyphase filter circuit for providing rejection of the image signal produced at an intermediate frequency by the mixing of an input carrier signal with a local oscillator signal in a first mixer to produce output signals in phase quadrature comprising:
   a first two phase active filter for receiving said quadrature IF signals I and Q from said mixer circuit; and,
   a second two phase active filter having first and second inputs connected to first and second outputs of said first active filter producing first and second signals for remodulation by a local oscillator of a subsequent quadrature mixer circuit forming quadrature carrier signals having a frequency of said input carrier signal, and which are adapted to be combined with said input carrier signal forming an input signal to said first mixer.

9. An active polyphase filter circuit for providing cancellation of an unwanted side band produced when an input signal is mixed with a local oscillator signal to provide an intermediate frequency signal comprising:

a polyphase active filter having a first input for receiving said intermediate frequency signal, and a second input;

a feedback network comprising a polyphase filter with first and second inputs, and first and second outputs, said second output connected with said active filter second input;

a summing means for combining a signal from said feedback network first output with said intermediate frequency signal; and means for supplying first and second signals from said polyphase active filter to a frequency converter for generating a carrier signal, and for supplying first and second quadrature related signals derived from said carrier signal to said feedback network first and second inputs.

10. A filter arrangement comprising:
(a) a polyphase filter having a set of paths therethrough for respective successively displaced phases of a signal, each said path being from a respective input to a respective output and being coupled to the next said path of the set so that said paths are coupled each to the next in sequence;
(b) a further signal path from each said output to the corresponding said input;
(c) means for injecting an input signal into a loop formed by a path through the filter and the corresponding said further signal path; and
(d) means for deriving an output signal from a loop formed by said path through the filter and said corresponding further signal path.

* * * * *